United States Patent
Min

(10) Patent No.: US 9,923,075 B2
(45) Date of Patent: Mar. 20, 2018

(54) LOW TEMPERATURE POLY-SILICON THIN FILM TRANSISTOR AND MANUFACTURING METHOD THEREOF

(71) Applicant: BOE TECHNOLOGY GROUP CO., LTD., Beijing (CN)

(72) Inventor: Jian Min, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/322,461

(22) PCT Filed: Oct. 15, 2015

(86) PCT No.: PCT/CN2015/092001
§ 371 (c)(1),
(2) Date: Dec. 28, 2016

(87) PCT Pub. No.: WO2016/206239
PCT Pub. Date: Dec. 29, 2016

(65) Prior Publication Data
US 2017/0133475 A1     May 11, 2017

(30) Foreign Application Priority Data

Jun. 23, 2015   (CN) .......................... 2015 1 0350156

(51) Int. Cl.
*H01L 29/76*     (2006.01)
*H01L 29/45*     (2006.01)
(Continued)

(52) U.S. Cl.
CPC ...... *H01L 29/458* (2013.01); *H01L 21/76805* (2013.01); *H01L 21/76895* (2013.01);
(Continued)

(58) Field of Classification Search
CPC .............. H01L 29/806; H01L 29/7839; H01L 29/41725–29/41791; H01L 29/66515;
(Continued)

(56) References Cited

U.S. PATENT DOCUMENTS

2007/0052043 A1   3/2007  Cha et al.
2010/0163847 A1*  7/2010  Majhi ............... H01L 21/28518
                                                              257/24
(Continued)

FOREIGN PATENT DOCUMENTS

CN    102064108 A    5/2011
CN    102947956 A    2/2013
(Continued)

OTHER PUBLICATIONS

First Office Action for Chinese Application No. 201510350156.7, dated Jun. 13, 2017, 7 pages.*
(Continued)

*Primary Examiner* — Kevin M Picardat
(74) *Attorney, Agent, or Firm* — Brooks Kushman P.C.

(57) ABSTRACT

A low temperature poly-silicon thin film transistor and a manufacturing method thereof are disclosed. The method includes forming an active layer on a base substrate, forming an ohmic contact layer on the active layer through an atomic layer deposition process, and forming a source electrode and a drain electrode on the ohmic contact layer. The ohmic contact layer includes a plurality of conductive ionic layers and a plurality of monocrystalline silicon layers/poly-silicon layers. The source electrode and the drain electrode are in contact with the active layer through the ohmic contact layer.

20 Claims, 2 Drawing Sheets

(51) Int. Cl.
*H01L 29/786* (2006.01)
*H01L 21/768* (2006.01)
*H01L 29/66* (2006.01)

(52) U.S. Cl.
CPC .. *H01L 29/66757* (2013.01); *H01L 29/78603* (2013.01); *H01L 29/78675* (2013.01)

(58) Field of Classification Search
CPC .......... H01L 29/665–29/66507; H01L 29/458; H01L 21/76805; H01L 21/76895; H01L 29/66757; H01L 29/78063; H01L 29/78675
USPC .......................................................... 257/66
See application file for complete search history.

(56) References Cited

U.S. PATENT DOCUMENTS

| | | | |
|---|---|---|---|
| 2011/0291147 A1* | 12/2011 | Hu | H01L 33/40 257/99 |
| 2011/0303921 A1 | 12/2011 | Shin et al. | |
| 2013/0277680 A1* | 10/2013 | Green | H01L 29/402 257/76 |
| 2013/0341678 A1* | 12/2013 | Green | H01L 21/31111 257/192 |
| 2016/0043114 A1 | 2/2016 | Mao | |
| 2016/0197293 A1 | 7/2016 | Chen et al. | |
| 2016/0247823 A1 | 8/2016 | Zuo et al. | |
| 2017/0133475 A1 | 5/2017 | Min | |

FOREIGN PATENT DOCUMENTS

| | | | |
|---|---|---|---|
| CN | 102983175 A | | 3/2013 |
| CN | 103474583 A | | 12/2013 |
| CN | 103545319 A | | 1/2014 |
| CN | 103730359 A | | 4/2014 |
| CN | 103839825 A | | 6/2014 |
| CN | 103985638 A | * | 8/2014 |
| CN | 104979215 A | * | 10/2015 |

OTHER PUBLICATIONS

International Search Report and Written Opinion for Application No. PCT/CN2015/092001, dated Mar. 31, 2016, 10 Pages.*

* cited by examiner

LOW TEMPERATURE POLY-SILICON THIN FILM TRANSISTOR AND MANUFACTURING METHOD THEREOF

CROSS-REFERENCE TO RELATED APPLICATIONS

This application is the U.S. national phase of PCT Application No. PCT/CN2015/092001 filed on Oct. 15, 2015, which claims priority to Chinese Patent Application No. 201510350156.7 filed on Jun. 23, 2015, the disclosures of which are incorporated in their entirety by reference herein.

TECHNICAL FIELD

The present disclosure relates to the field of display technology, in particularly to a low temperature poly-silicon thin film transistor and a manufacturing method thereof.

BACKGROUND

Compared with amorphous silicon (a-Si) thin-film transistors, low temperature poly-silicon thin film transistors (LTPS TFTs) have numerous advantages, such as high mobility which can reach approximately 10-100 $cm^2/Vs$, lower manufacturing temperature (below 600° C.), flexible selection of substrates, and low manufacturing costs. Due to the numerous excellent characteristics, the LTPS TFTs have significant advantages in the manufacturing of flexible displays, and have become the most important material for the production of flexible displays in the industry.

At present, in the process of manufacturing the LTPS TFT on a non-flexible glass substrate, source and drain regions of the LTPS active layer need to be heavily doped through an ion implantation process in order to form good ohmic contacts between the source electrode, the drain electrode and the LTPS active layer. Therefore, the contact resistances are reduced and better TFT electrical characteristics are obtained. It should be noted that after the heavily doping process, high temperature activation (high temperature annealing) at a temperature of 600° C. or more is necessary to substantially eliminate a large number of defects caused by doping in the active layer.

However, the upper temperature limit of the current flexible process is 400° C., and thus the high temperature activation following the ion implantation process cannot be carried out. Accordingly, the flexible substrate LTPS TFT manufactured by the above-mentioned non-flexible substrate TFT manufacturing method have very poor device characteristics and the large number of defects caused by heavily doping cannot be avoided.

There is no effective technical solution for the above-mentioned technical problem in the related art.

SUMMARY

The present disclosure aims to provide a technical solution where LTPS TFT devices can be formed on a flexible substrate below 400° C., avoiding the poor LTPS TFT device performances caused by the ion implantation process and high temperature activation.

To this end, the present disclosure provides a method of manufacturing a low temperature poly-silicon thin film transistor. The method includes: forming an active layer on a base substrate; forming an ohmic contact layer on the active layer through an atomic layer deposition process; and forming a source electrode and a drain electrode on the ohmic contact layer. The ohmic contact layer includes a plurality of conductive ionic layers and a plurality of monocrystalline silicon layers/poly-silicon layers. The source electrode and the drain electrode are in contact with the active layer through the ohmic contact layer.

Optionally, the forming an ohmic contact layer includes: forming a gate insulating layer, a gate electrode and an interlayer insulating layer on the active layer; forming via holes in the interlayer insulating layer, the gate insulating layer and the active layer through a dry etching process; and forming the conductive ionic layers and the monocrystalline silicon layers/poly-silicon layers in the via holes through the atomic layer deposition process. The interlayer insulating layer is located between the gate electrode and the source and drain electrodes.

Optionally, the thickness of the ohmic contact layer is not less than 100 Å and not more than 2000 Å.

Optionally, ions of the conductive ionic layers include boron ions or phosphor ions.

Optionally, an ion doping concentration of the conductive ionic layer is in the range of $10^{14}/cm^3$ to $10^{18}/cm^3$.

Optionally, the ions of the conductive ionic layers are boron ions and the threshold for the ion doping concentration is $10^{15}/cm^3$.

Optionally, the base substrate is a flexible substrate.

Optionally, the ohmic contact layer is formed on the active layer through the atomic layer deposition process below 300° C.

The present disclosure further provides a low temperature poly-silicon thin film transistor. The low temperature poly-silicon thin film transistor includes: a base substrate; an active layer arranged on the base substrate; an ohmic contact layer arranged on the active layer; and a source electrode and a drain electrode arranged on the ohmic contact layer. The ohmic contact layer includes a plurality of conductive ionic layers and a plurality of monocrystalline silicon layers/poly-silicon layers, and is formed on the active layer through an atomic layer deposition process. The source electrode and the drain electrode are in contact with the active layer through the ohmic contact layer.

Optionally, ions of the conductive ionic layers include boron ions or phosphor ions, and an ion doping concentration of the conductive ionic layer is in the range of $10^{14}/cm^3$ to $10^{18}/cm^3$.

Optionally, the ions of the conductive ionic layers are boron ions and the threshold for the ion doping concentration is $10^{15}/cm^3$.

Optionally, the base substrate is a flexible substrate, and the ohmic contact layer is formed on the active layer through the atomic layer deposition process below 300° C.

Compared with the related art, according to the low temperature poly-silicon thin film transistor and the manufacturing method thereof provided by the present disclosure, it is able to overcome the shortcomings that the low temperature poly-silicon thin film transistor formed on the flexible substrate using the ion implantation and high temperature activation processes has poor device performance. Lower temperatures below the temperature limit of the flexible substrate are satisfactory, and the ohmic contact layer having good interface contact may be accurately formed, thereby greatly improving the device performance of the low temperature poly-silicon thin film transistor on the flexible substrate.

DETAILED DESCRIPTION

Figure 1:
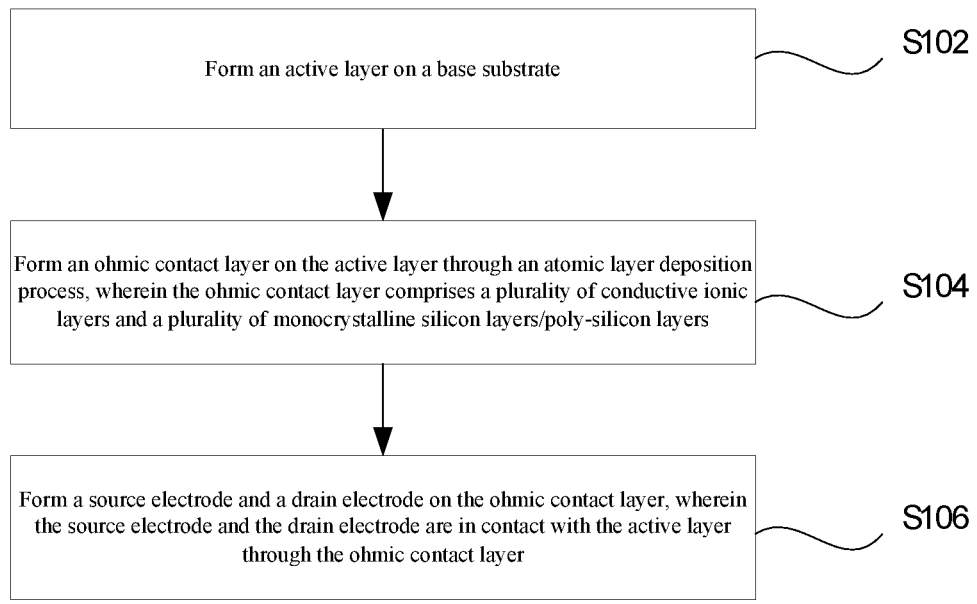
FIG. 1 illustrates a schematic diagram of a method of manufacturing a low temperature poly-silicon thin film transistor according to an embodiment of the present disclosure.

The technical solutions of embodiments of the present disclosure will be clearly and completely described below with reference to the accompanying drawings of the embodiments of the present disclosure. Apparently, the described embodiments are merely part of the embodiments of the present disclosure, but not all the embodiments. All other embodiments obtained by a person of ordinary skills in the art based on the described embodiments of the present disclosure are intended to be within the scope of the present disclosure.

Unless otherwise defined, technical or scientific terms used herein shall have the ordinary meanings as understood by a person of ordinary skills in the art to which the present disclosure belongs. The words "first," "second," and the like as used in the specification and claims of the present disclosure do not denote any order, amount or importance, but are merely used to distinguish different constituent parts. Similarly, the words "a" or "an" and the like are merely used to represent the existence of at least one member, rather than to limit the number thereof. The words "connect" or "connected" and the like are not limited to physical or mechanical connections, but may include electrical connections, whether direct or indirect. The words "on", "under", "left" and "right" and the like are merely used to indicate relative position relationships, and when an absolute position of the described object changes, the relative position relationships changes accordingly.

At present, in the process of manufacturing an LTPS TFT on a flexible substrate, heavily doped regions need to be formed between source and drain electrodes and a LTPS active layer through an ion implantation process and high temperature activation at a high temperature for a long time (e.g. two hours or more) is required, in order to form good ohmic contacts between the source and drain electrodes and the LTPS active layer. The temperature for the high temperature activation should be at least 600° C., but the highest temperature that the flexible substrate could withstand is about 400° C. and almost no activation effect exists at 400° C. Therefore, the back plates of existing flexible displays are poorly activated, and the defects caused by doping cannot be repaired, so that the electrical characteristics of the LTPS TFT device cannot meet the requirements.

In order to overcome the above-mentioned shortcoming, in the present disclosure, ohmic contact layers having good ohmic contacts with source and drain electrodes are formed by using an atomic layer deposition (ALD) method. Since the ALD method is performed below 400° C. and has a high deposition accuracy, the ALD method may replace the steps of ion implantation and high temperature activation. In the present disclosure, heavily doped monocrystalline silicon or poly-silicon layers are deposited prior to the forming of the source and drain electrodes, and then source and drain electrode metals are deposited using a magnetron sputter so as to form the LTPS TFT devices. Therefore, the problem that the LTPS TFT devices formed on flexible substrates using the existing ion implantation and high temperature processes activation have poor performances is addressed.

An embodiment of the present disclosure provides a method of manufacturing a LTPS TFT. FIG. 1 illustrates a schematic diagram of the method of manufacturing the LTPS TFT according to an embodiment of the present disclosure. As shown in FIG. 1, the flow includes the following steps (steps S102-S106):

S102, forming an active layer on a base substrate.

S104, forming an ohmic contact layer on the active layer through the ALD process. The ohmic contact layer includes a plurality of conductive ionic layers and a plurality of monocrystalline silicon layers/poly-silicon layers.

S106, forming a source electrode and a drain electrode on the ohmic contact layer. The source and drain electrodes are in contact with the active layer through the ohmic contact layer.

By means of the above-mentioned steps, ion implantation and high temperature activation are not necessary. Instead, the ALD process is employed to directly dope ions, so that an ohmic contact layer having good ohmic contacts is formed between the active electrode and the source and drain electrodes.

In the embodiment of the present disclosure, the step S104 may be implemented in the following manner: forming a gate insulating layer, a gate electrode and an interlayer insulating layer on the active layer, wherein the interlayer insulating layer is located between the gate electrode and the source and drain electrodes; forming via holes in the interlayer insulating layer, the gate insulating layer and the active layer through a dry etching process; and forming the conductive ionic layers and the monocrystalline silicon layers/poly-silicon layers layer by layer in the via holes through the ALD process.

Since the ALD process has the advantage of high accuracy, a very thin ohmic contact layer is required to be deposited to ensure a high electron mobility between the source and drain electrodes. In the present embodiment, for a better effect, an optional thickness range may be set for the ohmic contact layer to be deposited, e.g. not less than 100 Å and not more than 2000 Å.

At present, the conductive ions doped in the active layer mainly include boron ions or phosphor ions. These two types of ions may be adopted in the embodiment of the present disclosure. That is, optionally, in the embodiment of the present disclosure, the ions of the conductive ionic layers may include boron ions or phosphor ions. Apparently, although only the two types of ions at present result in good conductivities when doped in the active layer, other ions may be considered in practice with the development of technologies, and the present disclosure is not limited thereto.

In the embodiment of the present disclosure, the ion doping concentration of the conductive ionic layer is in the range of $10^{14}/cm^3$ to $10^{18}/cm^3$. It should be noted that this doping concentration meets the heavily doping requirement, so that the ohmic contact layer formed by doping is satisfactory.

Further, in order to simplify the processes and to increase the conductivity of the above-mentioned ohmic contact layer, boron ions may be used in the conductive ionic layer to be formed with the monocrystalline silicon layers/poly-silicon layers through the ALD process. The threshold for the doping concentration is $10^{15}/cm^3$ when the ions of the conductive ionic layer are boron ions.

In the embodiment of the present disclosure, the base substrate may be a flexible substrate. The highest temperature that the flexible substrate can withstand is 400° C., and the ALD process is performed at a temperature of 20° C.-300° C. That is, the ohmic contact layer is formed below 300° C. using the ALD process. Therefore, the above-mentioned method is appropriate for producing flexible substrate-based LTPS TFTs. Apparently, this does not prevent the above-mentioned method from being used in manufacturing non-flexible substrate based LTPS TFTs.

It can be seen that in the embodiment of the present disclosure, the ohmic contact layers (which may be also referred to as transition layers since the ohmic contact layers are very thin and are not separately arranged from the active layer) are formed at ends of the source and drain electrodes by the ALD process. With this method, the damages caused high temperatures in the flexible substrate can be avoided, and also the large number of defects caused by ion implantation in the active layer can be avoided. Therefore, this method is of great significance to the flexible processes and the mass production of the flexible products.

The method of manufacturing a LTPS TFT provided by the above-mentioned embodiment will be described in detail with reference to FIGS. 2-4 and optional embodiments.

Figure 2:
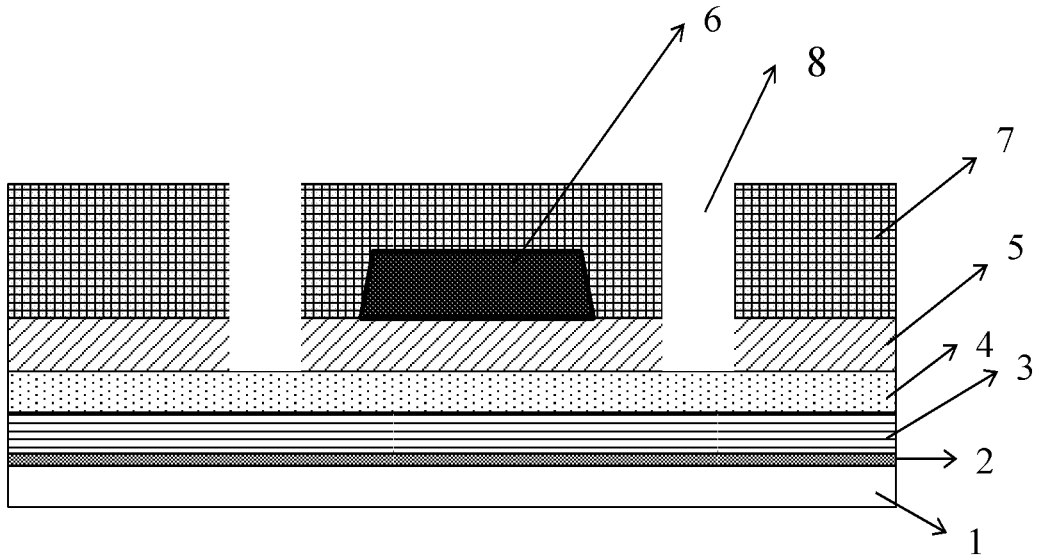
FIG. 2 illustrates a schematic diagram in which SD through holes are formed according to an embodiment of the present disclosure.
Figure 3:
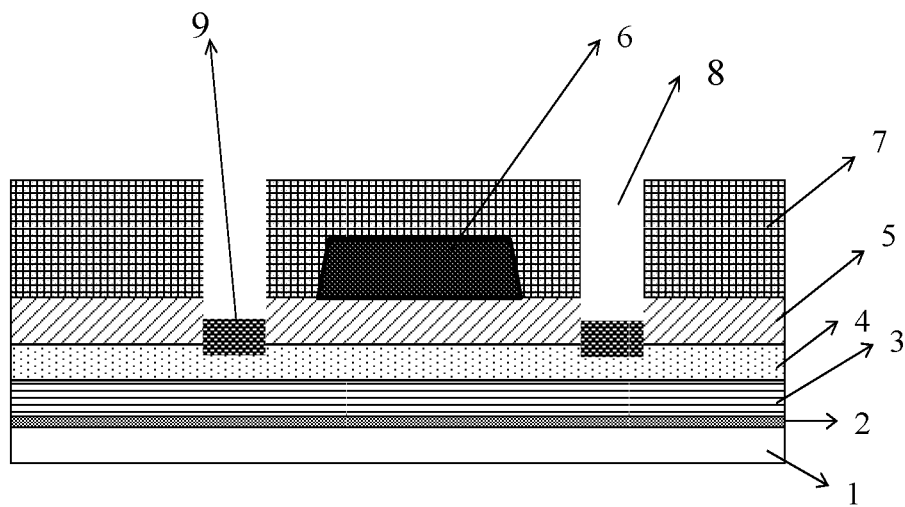
FIG. 3 illustrates a schematic diagram in which an ohmic contact layer is formed according to an embodiment of the present disclosure.
Figure 4:
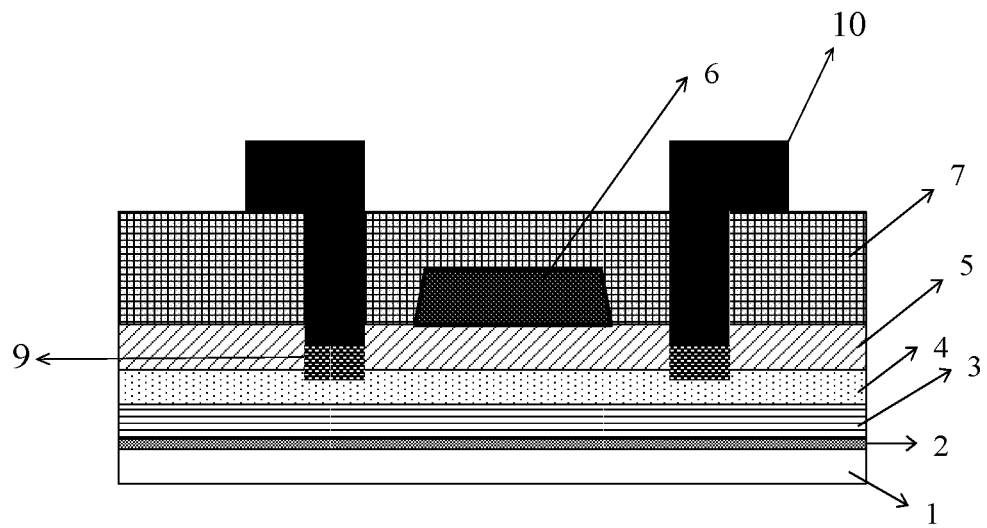
FIG. 4 illustrates a schematic diagram of an ultimately formed LTPS TFT according to an embodiment of the present disclosure.

It should be noted that the present optional embodiment is illustrative of the process of manufacturing the LTPS TFT on the flexible substrate with reference to FIGS. 2-4. The process includes the following steps:

(1) Forming a flexible substrate 2 on a glass substrate 1. In practical implementation, the flexible substrate may be made of polyethylene terephthalate (PET) or polyethylene naphthalate (PEN). Then a planarization layer (i.e. a buffer layer) 3 is formed on the flexible substrate. The planarization layer may be a SiOx film layer or a SiNx film layer or a multilayer formed by SiOx and SiNx films. The planarization layer may have a thickness in the range of 1000 Å to 4000 Å, so as to serve as a better barrier layer and provide a planarization effect.

(2) Depositing an a-Si layer on the buffer layer 3 using a Plasma Enhanced Chemical Vapor Deposition (PECVD) method. The deposition temperature is controlled below 400° C. and the a-Si layer has a thickness of 300 Å to 1000 Å. Then, dehydrogenation annealing is performed at a temperature of approximately 400° C. for 100 minutes or longer.

(3) Performing a crystallization treatment on the deposited a-Si through an excimer laser annealing (ELA) process. The ELA process may employ 308 nm XeCl laser, and the laser overlapping ratio is in the range of 90% to 98%. After the ELA process, a-Si layer undergoes reconstruction due to the laser energy to become a poly-Si layer as an active layer 4 of the device.

(4) Performing channel doping on the poly-Si layer through an ion implantation process to adjust the threshold voltage of the device and enhance the stability of the device. It should be noted that, this step is optional in the present optional embodiment and may be omitted in practice.

(5) Depositing a gate insulating (GI) layer 5 on the formed active layer 4 through the PECVD process. The GI layer 5 may be a SiOx film layer, a SiNx film layer, or a multilayer of SiOx and SiNx film layers. The GI layer may have a thickness in the range of 500 Å to 4000 Å. The thickness may be selected based on the particular process conditions.

(6) Depositing a gate electrode using a magnetron sputter. The gate electrode may have a thickness in the range of 800 Å to 3000 Å, and metals such as Al, Mo, Cu, W or an alloy thereof may be used. After deposition, the gate electrode is patterned by an exposure, development, and etching processes to form the gate metal layer 6.

(7) After the gate metal layer 6 is formed, an interlayer dielectric layer (ILD) is deposited through the PECVD process to avoid short circuits between the gate metal layer and the source and drain electrodes. The ILD may have a thickness in the range of 2000 Å to 6000 Å, and the deposition material may be SiOx, SiNx or a combination thereof. These deposition processes are performed below 400° C.

(8) Etching via holes 8 for forming the source and drain electrodes at the positions corresponding to the source and drain electrodes through a dry etching process. The via holes 8 are in communication with the poly-Si in the active layer 4. It should be noted that S/D (S refers to the source electrode and D refers to the drain electrode) and rapid thermal annealing (RTA) activation at 600° C. or more are required prior to this step in the non-flexible process so as to form good ohmic contacts. However, these steps are omitted in the present optional embodiment, so that the present optional embodiment is more suitable for the flexible substrate process.

Here, for ease of understanding the above-mentioned steps, reference can be made to FIG. 2, which illustrates a schematic diagram in which SD via holes are formed according to the optional embodiment of the present disclosure.

(9) Depositing a heavily doped (the doped material is the boron atom, which is converted to the conductive boron ion when doped) monocrystalline silicon or poly-silicon layer below 300° C. through the ALD process, which is used as a transition layer (i.e. the above-mentioned ohmic contact layer) 9 for the source and drain electrodes. The deposition thickness is in the range of 100 Å to 2000 Å. Since the deposition material is monocrystalline silicon or poly-silicon which can be in good contact with the active layer and the atomic-level deposition in the ALD process provides a high accuracy, the defects at the interface may be fully repaired and good ohmic contacts are formed eventually.

(10) Patterning the transition layer 9 by an exposure, development, and etching processes after the transition layer 9 is deposited, so that the heavily doped material deposited by the ALD process is in close contact with the active layer 4 in the via hole 8.

For ease of understanding, reference may be made to FIG. 3, which illustrates a schematic diagram in which an ohmic contact layer is formed according to an optional embodiment of the present disclosure.

(11) Depositing source and drain electrodes 10 using a magnetron sputter, after the transition layer 9 is patterned. The electrodes may have a thickness in the range of 1000 Å to 3000 Å, and metals such as Al, Mo, Cu, W or an alloy thereof may be used. After deposition, the gate electrode is patterned by an exposure, development, and etching processes. Then, the manufacturing of the LTPS TFT on the flexible substrate is completed.

For ease of understanding, reference may be made to FIG. 4, which illustrates a schematic diagram of an ultimately formed LTPS TFT according to an optional embodiment of the present disclosure.

According to the present optional embodiment, the source and drain electrodes are not required to be heavily doped, thereby avoiding the pollution of the ion implantation process to the device and the large number of defects caused in the active layer. Additionally, there is no high temperature activation after the ion implantation process, and thus the flexible process is completely compatible with the low deposition temperature. Since the ALD process can accurately ensure complete contact at the interface and heavily doped monocrystalline silicon or polysilicon can be deposited at low temperatures, good ohmic contacts are formed with the source and drain electrode metals.

With respect to the above-mentioned method of manufacturing the LTPS TFT, an embodiment of the present disclosure provides a LTPS TFT (which will not be described in conjunction with the drawings, and the manufacturing process of the LTPS TFT can refer to FIGS. 2-4), which includes: a base substrate; an active layer arranged on the base substrate; an ohmic contact layer arranged on the active layer, and a source electrode and a drain electrode arranged on the ohmic contact layer. The ohmic contact layer includes a plurality of conductive ionic layers and a plurality of monocrystalline silicon layers/poly-silicon layers, and is formed on the active layer through an atomic layer deposition process. The source and drain electrodes are in contact with the active layer through the ohmic contact layer.

In the embodiment of the present disclosure, ions of the conductive ionic layers may include boron ions or phosphor ions, and an ion doping concentration of the conductive ionic layer may be in the range of $10^{14}/cm^3$ to $10^{18}/cm^3$. The threshold for the doping concentration is $10^{15}/cm^3$ under the circumstance that the ions of the conductive ionic layer are boron ions.

In the embodiment of the present disclosure, the base substrate may be a flexible substrate and the ohmic contact layer is formed on the active layer through the atomic layer deposition process below 300° C.

According to the embodiment of the present disclosure, the ALD deposition requires a temperature of 20° C.-300° C., which is much lower than the temperature limit of the flexible substrate. The accurate deposition process allows the interface to have good contacts, and also can get better ohmic contacts. Therefore the performance of the LTPS TFT on the flexible substrate is greatly improved. These aspects are of significance to the application of the flexible display technologies.

The above-mentioned embodiments are merely optional embodiments of the present disclosure. It should be noted that improvements and modifications may be made by those skilled in the art without departing from the technical principles of the present disclosure. These improvements and modifications should also be considered within the scope of protection of the present disclosure.

What is claimed is:

1. A method of manufacturing a low temperature poly-silicon thin film transistor, comprising:
   forming an active layer on a base substrate;
   forming an ohmic contact layer on the active layer through an atomic layer deposition process, the ohmic contact layer comprising a plurality of conductive ionic layers and a plurality of monocrystalline silicon layers/poly-silicon layers; and
   forming a source electrode and a drain electrode on the ohmic contact layer, the source electrode and the drain electrode being in contact with the active layer through the ohmic contact layer.

2. The method according to claim 1, wherein the forming an ohmic contact layer comprises:
   forming a gate insulating layer, a gate electrode and an interlayer insulating layer on the active layer, the interlayer insulating layer being located between the gate electrode and the source and drain electrodes;
   forming via holes in the interlayer insulating layer, the gate insulating layer and the active layer through a dry etching process; and
   forming the conductive ionic layers and the monocrystalline silicon layers/poly-silicon layers in the via holes through the atomic layer deposition process.

3. The method according to claim 1, wherein a thickness of the ohmic contact layer is not less than 100 Å and not more than 2000 Å.

4. The method according to claim 1, wherein ions of the conductive ionic layers comprise boron ions or phosphor ions.

5. The method according to claim 4, wherein an ion doping concentration of the conductive ionic layer is in the range of $10^{14}/cm^3$ to $10^{18}/cm^3$.

6. The method according to claim 5, wherein the ions of the conductive ionic layers are boron ions and a threshold for the ion doping concentration is $10^{15}/cm^3$.

7. The method according to claim 1, wherein the base substrate is a flexible substrate.

8. The method according to claim 7, wherein the ohmic contact layer is formed on the active layer through the atomic layer deposition process below 300° C.

9. The method according to claim 2, wherein ions of the conductive ionic layers comprise boron ions or phosphor ions.

10. The method according to claim 9, wherein an ion doping concentration of the conductive ionic layer is in the range of $10^{14}/cm^3$ to $10^{18}/cm^3$.

11. The method according to claim 10, wherein the ions of the conductive ionic layers are boron ions and a threshold for the ion doping concentration is $10^{15}/cm^3$.

12. The method according to claim 3, wherein ions of the conductive ionic layers comprise boron ions or phosphor ions.

13. The method according to claim 12, wherein an ion doping concentration of the conductive ionic layer is in the range of $10^{14}/cm^3$ to $10^{18}/cm^3$.

14. The method according to claim 13, wherein the ions of the conductive ionic layers are boron ions and a threshold for the ion doping concentration is $10^{15}/cm^3$.

15. A low temperature poly-silicon thin film transistor, comprising:
   a base substrate;
   an active layer arranged on the base substrate;
   an ohmic contact layer arranged on the active layer, the ohmic contact layer comprising a plurality of conductive ionic layers and a plurality of monocrystalline silicon layers/poly-silicon layers, and the ohmic contact layer being formed on the active layer through an atomic layer deposition process; and
   a source electrode and a drain electrode arranged on the ohmic contact layer, and being in contact with the active layer through the ohmic contact layer.

16. The low temperature poly-silicon thin film transistor according to claim 15, wherein
   the base substrate is a flexible substrate, and
   the ohmic contact layer is formed on the active layer through the atomic layer deposition process below 300° C.

17. The low temperature poly-silicon thin film transistor according to claim 15, wherein
   ions of the conductive ionic layers comprise boron ions or phosphor ions, and
   an ion doping concentration of the conductive ionic layer is in the range of $10^{14}/cm^3$ to $10^{18}/cm^3$.

18. The low temperature poly-silicon thin film transistor according to claim 17, wherein the ions of the conductive ionic layers are boron ions and a threshold for the ion doping concentration is $10^{15}/cm^3$.

19. The low temperature poly-silicon thin film transistor according to claim 17, wherein
   the base substrate is a flexible substrate, and
   the ohmic contact layer is formed on the active layer through the atomic layer deposition process below 300° C.

20. The low temperature poly-silicon thin film transistor according to claim 18, wherein
   the base substrate is a flexible substrate, and
   the ohmic contact layer is formed on the active layer through the atomic layer deposition process below 300° C.

* * * * *